United States Patent [19]

Mortensen

[11] Patent Number: 4,687,097
[45] Date of Patent: Aug. 18, 1987

[54] WAFER PROCESSING CASSETTE

[75] Inventor: Roger L. Mortensen, Chanhassen, Minn.

[73] Assignee: Empak, Inc., Chanhassen, Minn.

[21] Appl. No.: 680,516

[22] Filed: Dec. 11, 1984

[51] Int. Cl.$^4$ .............................................. B65D 85/30
[52] U.S. Cl. .................................... 206/334; 206/454; 211/40
[58] Field of Search ...................... 206/454, 334, 328; 211/40; 118/500

[56] References Cited

U.S. PATENT DOCUMENTS

| 3,923,156 | 12/1975 | Wallestad | 206/454 |
| 3,961,877 | 6/1976 | Johnson | 206/454 |
| 4,471,716 | 9/1984 | Milliren | 206/454 |
| 4,493,418 | 1/1985 | Johnson | 206/454 |

Primary Examiner—Joseph Man-Fu Moy
Assistant Examiner—Jimmy G. Foster
Attorney, Agent, or Firm—Hugh D. Jaeger

[57] ABSTRACT

Wafer cassette for processing of silicon wafers which includes a plurality of open supported reinforced wafer dividers for supporting a plurality of wafers in alignment in opposing dividers of the cassette and for automated robotic processing of the wafers while in the cassette. The wafer cassette utilizes an H-bar end with a configured rod reinforced open H-front which is fully functional and strategically located. The dividers are supported by one or two pairs of longitudinal horizontal supports secured to the ends providing for an open area between each of the dividers for passage of liquids during automated processing, and vertical support bars are provided for strengthening of positioning members of the cassette. The rear end includes a downward arch. The processing wafer cassette provides for "on-center" processing where the carrier center of gravity is on-center of the axis of centrifugal wafer processing machinery. Each of the dividers in cross section are geometrically configured for passage of chemicals during processing.

2 Claims, 18 Drawing Figures

WAFER PROCESSING CASSETTE

BACKGROUND OF THE INVENTION

1. Field of the Invention.

The present invention relates to a wafer cassette for processing of silicon wafers utilized in integrated circuits, and more particularly, pertains to a wafer cassette with geometrically configured teeth and side members, and reinforced upper edge members for carrying a plurality of silicon wafers for integrated circuit processing in known processes including on-center, centrifugal, bath immersion, and in-line one-wafer-at-a-time processing.

2. Description of the Prior Art.

The prior art wafer cassettes have been heavy, bulky and expensive, and containing specific structural material not providing for an open area for processing of the wafers. The prior art cassettes block spray patterns and processing liquids, and also are of light structural strength, such that the prior art cassettes would flex, bend, or break during the processing, destroying the silicon wafers or the circuitry on the silicon wafers. Also, the profiles of the prior art wafer cassettes were high and were of considerable weight, thereby locking the structural integrity required for high yield of integrated circuits in automated integrated circuit processing equipment.

The present invention overcomes the disadvantages of the prior art by providing a wafer processing cassette for processing silicon wafers, or the like, which includes an H-bar end, a low profile of structure providing for maximum open surface area and perimeter when spraying, open areas between each of the reinforced geometrically configured dividers, provides for on-center processing of integrated circuit wafers in automated integrated circuit processing equipment, and includes vertical strengthening bars for support of positioning pins and holes. The present invention provides a wafer processing cassette for all automated robotic processing. The wafer processing cassette can be made from Teflon which withstands chemical etching process in addition to being accepted by robotic wafer automated machines.

SUMMARY OF THE INVENTION

The general purpose of the present invention is to provide a wafer cassette for processing of integrated circuit wafers such as silicon wafers or the like which provides low-profile structure for on-center processing of the cassette by advanced generation integrated circuit robotic wafer processing equipment. The wafer processing cassette includes an integral structure of the cassette with strategically located components of the H-bar end and geometrically configured reinforced wafer dividers providing for open, non-restricted areas for integrated circuit processing. Also, the wafer cassette is of an extremely low profile and of minimal weight, which provides for a lower unit cost to the integrated circuit processor.

According to one embodiment of the present invention there is provided a wafer cassette for processing of integrated circuit wafers, such as silicon wafers including a substantially rectangular configured H-bar front end including a ramped upper portion, a rectangular lower portion, and a partial cylindrical reinforcing rod running the longitudinal length of the center of the H-bar end, upper edge members having locating pins and holes, forward and rearward vertical support bars in support of horizontal structure supports in the area of the locating pins and holes, a plurality of reinforced wafer dividers having geometrically shaped teeth, the reinforced exterior portion being more round in shape than the interior portion of the teeth, opposing horizontal longitudinal structural supports secured to the front H-bar support and a rear end at a upper and lower mid portion of the dividers, or mid portion of the dividers, and angled rounded opposing sides above a reinforced bottom edge for perimeter contact, whereby the open H-bar end and downward arch rear end provide for maximum open end areas. The open dividers with geometrically configured teeth of dual rounded faces provide for maximum surface area for processing functions thereby providing a fully functional strategically located low-profile least weight wafer cassette of structural integrity for on-center processing of integrated circuit wafers. The H-bar front end is a partial cylindrical rod extending between vertical sides. The plurality of reinforced dividers have uniquely shaped teeth, the exterior portion being rounded in shape providing for additional strength and efficient chemical processing, and being supported by lower and upper opposing horizontal longitudinal structure supports securing to the front H-bar support and the rear end support of the wafer cassette. Partial outwardly extending dividers secured to a mid portion of the dividers provides for further support.

One significant aspect and feature of the present invention is a wafer cassette which is fully functional, and includes a strategically located H-bar end, for structural integrity and an open area for nonrestricting processing of silicon wafers for integrated circuits. Structural integrity is insured by the cross sections of the dividers and a partial cylindrical rod secured across the H-bar end.

Another significant aspect and feature of the present invention is a wafer cassette which provides for on-center processing of integrated circuits. The wafer cassette provides that the center of gravity of the wafer cassette carrier is on-center of the axis of integrated circuit centrifugal processing machinery. Vertical tabs are provided to assist in structural integrity for robotic automation.

A further significant aspect and feature of the present invention is a wafer cassette which provides considerable open surface area and open perimeters between the dividers.

An additional significant aspect and feature of the present invention is a wafer cassette which has an extremely low profile, and is of minimal weight with maximum structural integrity for automated processing equipment.

A still additional significant aspect and feature of the present invention is a low profile open H-bar and for automatic wafer handling equipment. While industry standard equipment requires the standard H-bar configuration profile, this low profile H-bar falls within the required industry profile for automated processing equipment.

Still another significant aspect and feature of the present invention are sloping and rounded surfaces and corners for drainage of fluids from the surfaces. The corners are sloped rounded, smooth and filled thereby preventing particle or particulate contamination during processing of the wafers.

A yet further significant aspect and feature of the present invention is teeth like dividers having a large profile including exterior rounded teeth backs which provide for further rigidity of the dividers and the wafer cassette carrier, as well as effective fluid drainage while having interior teeth of small profiles.

A yet further additional significant aspect and feature of the present invention are vertically placed support bars for strengthening of upper edge members at the locating pins and holes facilitating further stress handling capabilities during wafer processing.

Having thus described embodiments of the present invention, it is a principal object hereof to provide a low profile wafer cassette having structural integrity for integrated circuit processing such as silicon wafers.

One object of the present invention is a fully functional, on-center processing wafer cassette which provides for non-restrictive processing during robotic automated steps of integrated circuit wafer processing.

An additional object of the present invention is a wafer processing cassette which is produced from Teflon PFA or like material at an economical price cost, and which withstands high temperatures and acidic chemicals such as sulfuric acid.

BRIEF DESCRIPTION OF THE DRAWINGS

Other objects and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 2a illustrates a divider in cross-section;

FIG. 7a illustrates a divider in cross-section;

FIG. 12a illustrates a divider in cross-section;

DESCRIPTION OF THE PREFERRED EMBODIMENTS

Figure 1:
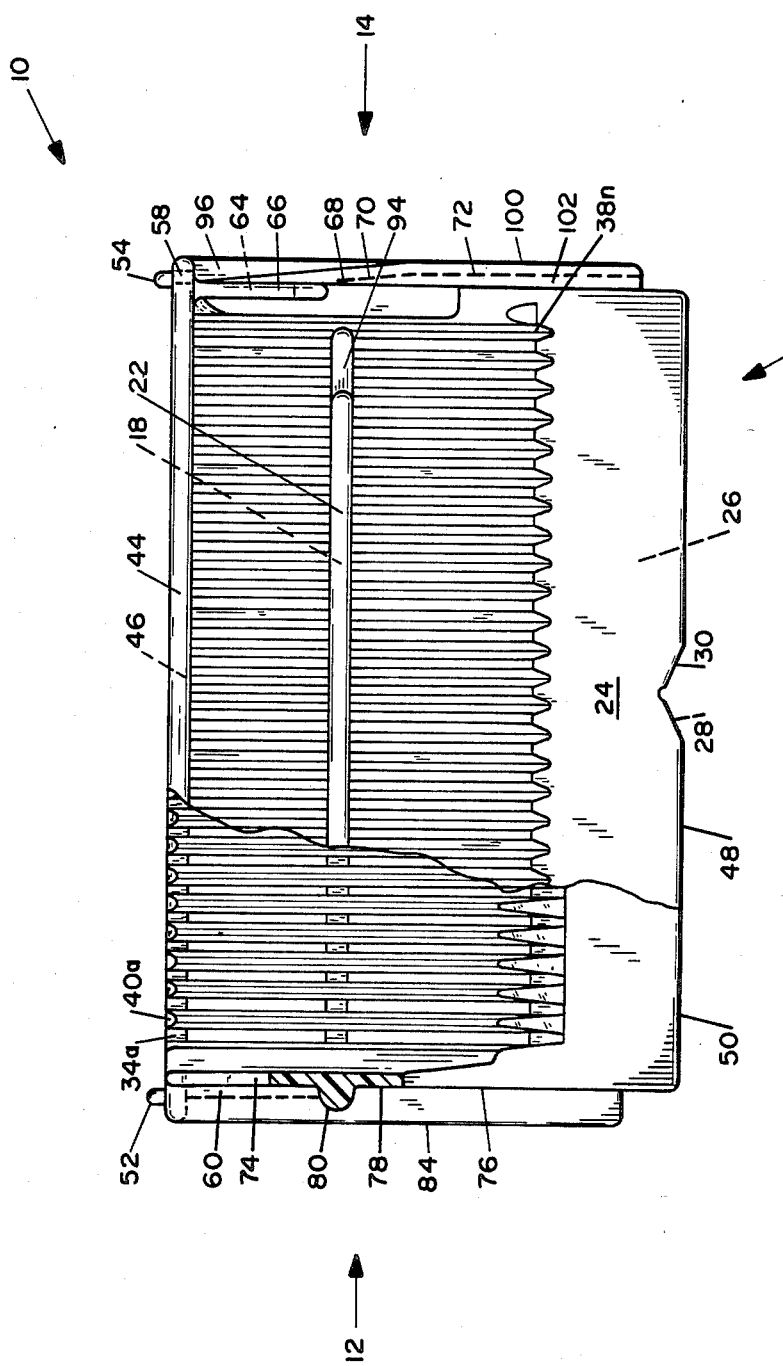
FIG. 1 illustrates a plan view of a wafer processing cassette including a portion partially cut away.
Figure 2:
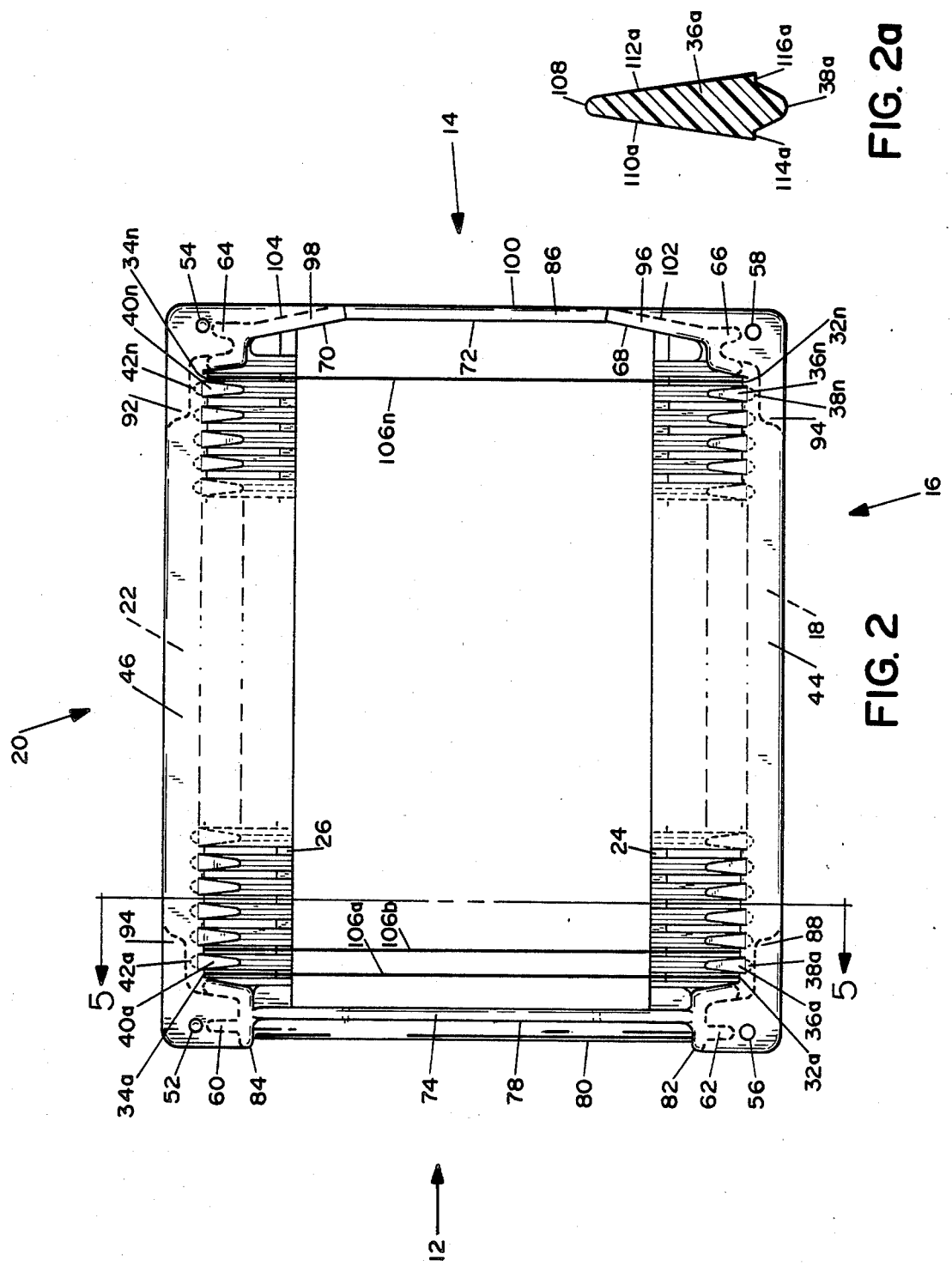
FIG. 2 illustrates a top view.

FIG. 1 illustrates a plan view of a wafer processing cassette 10, the present invention, for processing of integrated circuit wafers such as silicon wafers, including a partially cut away section. Reference is also made to FIGS. 1-5 in the following description. The wafer cassette 10 includes an H-bar end 12, also illustrated in FIG. 3 and which includes an open area, a rear end 14, which includes an open area, also illustrated in FIG. 4, a right side 16 including an upper edge member 44, a right horizontal structural support 18, lower edge member 24, lower edge 48, a positioning groove 30, a left side 20 including an upper edge member 46, lower edge member 26, including lower edge 50 and positioning groove 28, and left horizontal structural support 22. Angle notches 88 and 94 are located at the outward ends of right horizontal structural support 18 and angle notches 90 and 92 are located at the ends of left horizontal structure support 22. A plurality of right indexing slots 32a–32n and left indexing slots 34a–34n opposing the right indexing slots are also provided for in the lower edges. A plurality of geometrically configured wafer dividers assuming geometrical shapes of rounded teeth 36a–36n and 40a–40n are in opposing alignment with respect to each other, as also shown in FIGS. 2 and 2a, and are supported by the structural supports 18 and 22, lower edge members 24 and 26, and upper edge members 44 and 46 which extend between the front and rear ends 12 and 14, respectively. The horizontal structural supports 18 and 22, as well as the dividers, correspond to the geometry of the radial circumference of the wafer providing slight perimeter contact with the wafer and in this particular instance corresponds to a 100 millimeter diameter wafer. Rounded lower support horizontal edges or horizontal structure supports 18 and 22 connect between the ends and provide additional perimeter edge support for wafers. These supports extend outwardly along a portion of the horizontal length as illustrated in the figures and as described.

Figure 3:
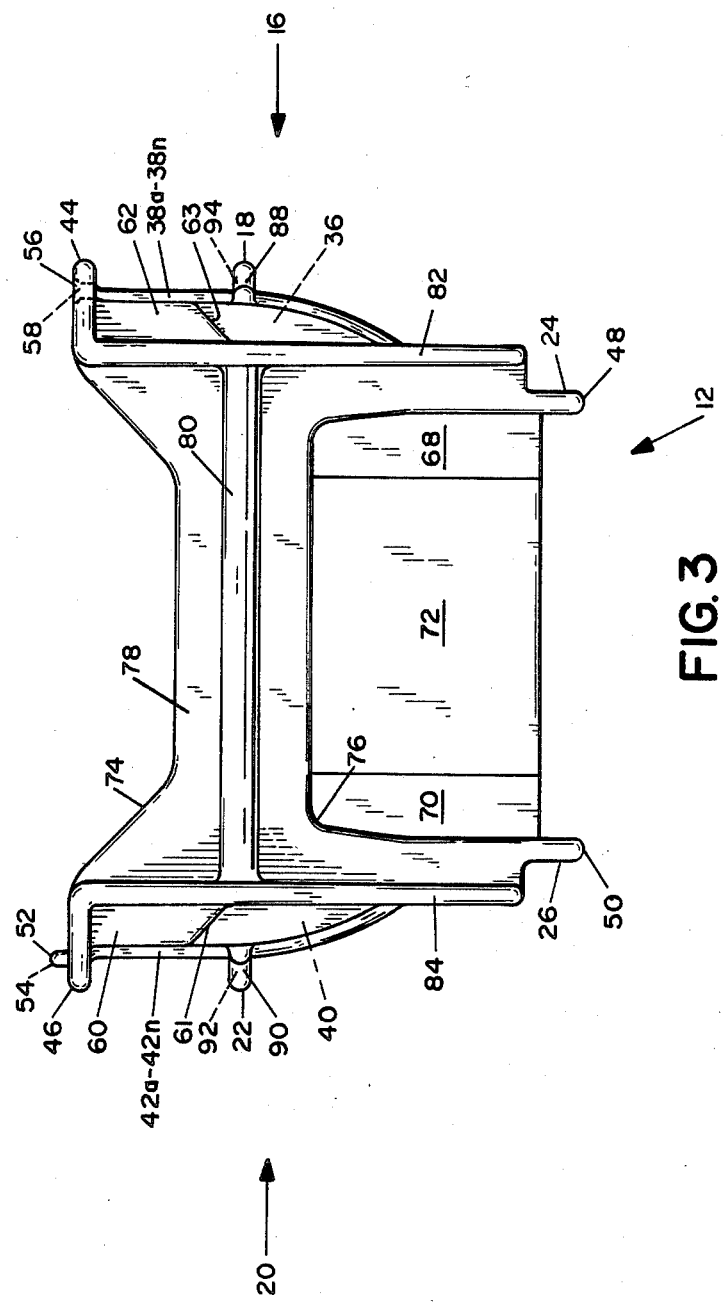
FIG. 3 illustrates the H-bar end, front view.
Figure 4:
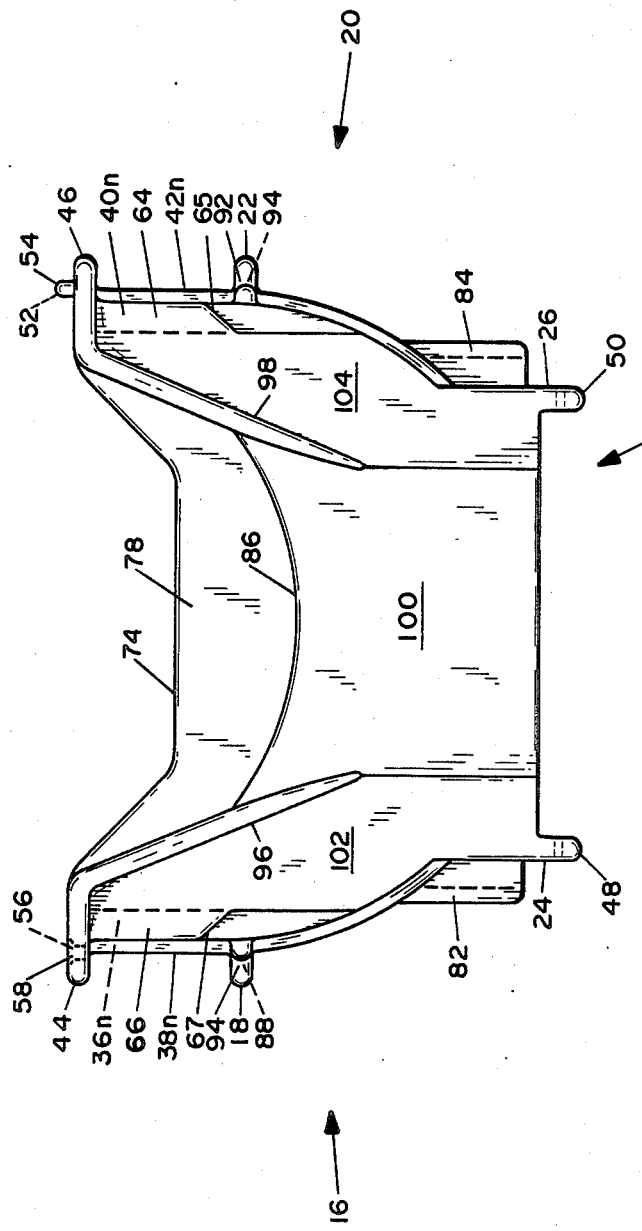
FIG. 4 illustrates a rear, end view.

The wafer processing cassette 10 includes processing locating pins 52 and 54, and processing locating holes 56 and 58. The cassette 10 also includes opposing angled interior sides 68 and 70, and an interior end 72. The H-bar end 12 includes a ramped top edge 74 and an open area above it and a rounded lower edge 76 with a rectangular like open area beneath it, as illustrated in FIG. 3. The H-bar center 78 includes a partial section of a cylindrical rod 80 extending between members 82 and 84. H-bar end 12, and vertical edge bar members on the right side 82 and on the left side 84 provide for additional support and bearing surfaces, 61 and 63. Forward locator vertical support bars 60 and 62 with inwardly ramped bottom surfaces 61 and 63, extend outwardly and downwardly from the junction area of upper edge member 46 and the exterior surface of vertical edge bar 84, and also from upper edge member 44 and the exterior surface of vertical edge bar 82, respectively. Rear locator vertical support bars 64 and 66 extend in a like manner outwardly and downwardly with inwardly ramped bottom surfaces 65 and 67 from the junction area of the rear upper edge of upper edge member 46 and adjacent to surface 104 and also adjacent to surface 104 and 102 as shown in FIGS. 2, 3, and 4.

FIG. 2 illustrates a top view of a wafer cassette 10 where all numerals correspond to those elements previously described. Particularly, wafers 106a–106n are illustrated for being supported in between the wafer dividers 36a–36n and 40a–40n. The top view also illustrates the unique geometrical shape of the wafer teeth with rounded exterior and interior edge of each tooth. The locating pins 52 and 54 and locating holes 56 and 58 with forward and rear locator vertical support bars 60, 62, 64, and 66 are shown accordingly. Angle notches 88, 90, 92, and 94 are illustrated at the ends of the horizontal structural supports 18 and 22 providing for minimum weight of the cassette.

FIG. 2a illustrates a cross-section of representative dividing tooth 36a of teeth 36a-36n opposing divider teeth 40a-40n, including a rounded interior tooth edge 108a, left and right vertical sides 110a and 112a, exteriorly facing substantially flat surfaces 114a, and 116a, and rounded exterior tooth edge strengthener 38a for each tooth. The sides 110a and 112a are at an angle with respect to each other.

FIG. 3 illustrates a front view of the H-bar end 12, where all numerals correspond to those elements previously described. In particular, the ramped portion 74 of the H-bar end, as well as the rounded edges of the rectangular portion 76 are illustrated along with the supporting partial cylindrical rod 80, as well as the rounded exterior tooth edge strengtheners 38a-38n and 42a-42n which intersect with horizontal upper edge members 44 and 46, horizontal structural supports 18 and 22, as well as lower edge members 24 and 26 of FIG. 4, all contributing to structural support and strength of the wafer processing cassette 10. The vertical edges 82 and 84 provide and act as bearing surfaces, as well as ramped surfaces 61 and 63. The cassette can be utilized in an upright position during automated wafer processing when the cassette is in a horizontal mode or in a vertical mode. Each of the dividers' outer edges extends vertically to the horizontal supports, and then conformingly curves to the wafer.

FIG. 4 illustrates a rear end view of the wafer cassette 10 where all numerals correspond to those elements previously described. Particularly illustrated is the rounded open area reversed arch 86 providing the rear end open portion. Reinforcing edges 96 and 98 extending downwardly and inwardly from the upper edge members 44 and 46, and provide for additional rear-end structural support and connect to surface rear 100. The surfaces 96, 98, and 100 also serve as bearing surfaces. Surfaces 102 and 104 also provide for rear-end support as illustrated.

MODE OF OPERATION

The wafers 106 are positioned into the wafer cassette 10 for processing. The cassette can also be used for storage or for transportation. The intended purpose of the present invention, though, is for robotic automated processing. The wafer cassette 10 can be utilized on-center processing equipment or other types of processing equipment. The wafer cassette 10 is unique in being functional for all types of processing equipment for integrated circuits in a horizontal or a vertical mode.

Figure 5:
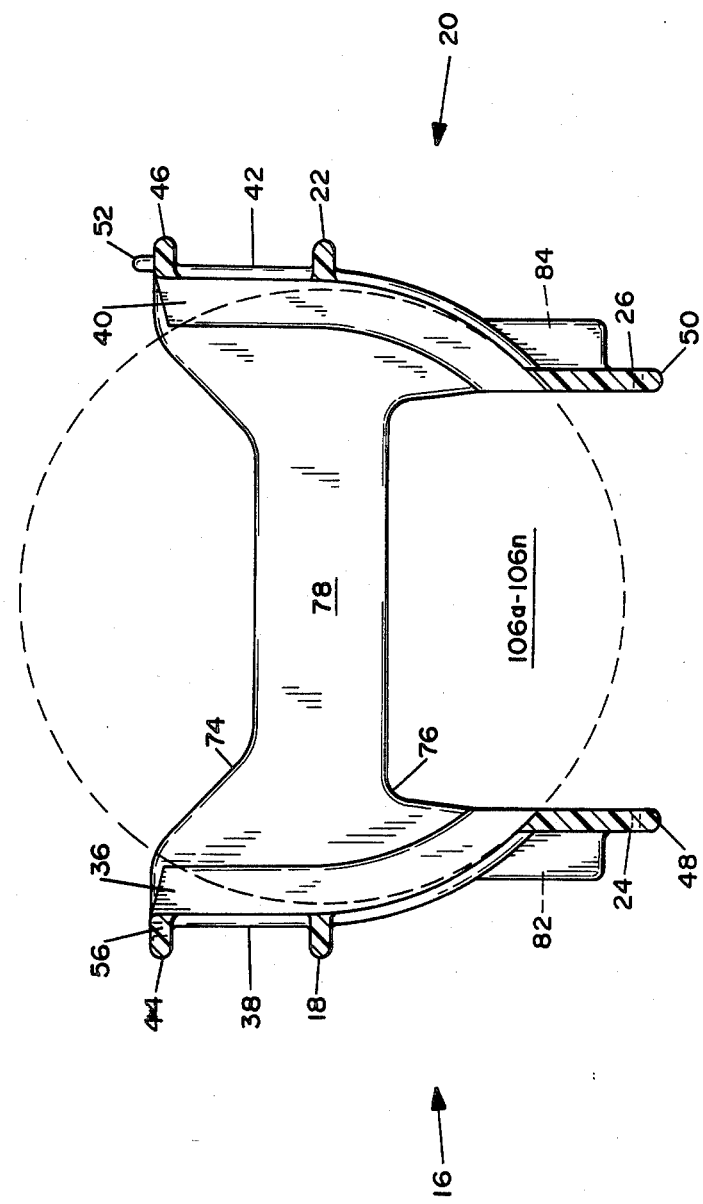
FIG. 5 illustrates a view taken along line 5—5 of FIG. 2.

FIG. 5 particularly illustrates a view taken along line 5—5 of FIG. 2 showing the point contact, as well as perimeter contact to the edges of the wafer disk 106 which is minimized for purposes of processing by automated equipment.

In this invention, the dividers supporting the wafers are supported by structure providing for maximized open area for such automated processing steps. Fluids, as well as air, or gaseous vapors, can pass through the open areas of the dividers and about the open ends, especially during chemical processes or washing processes. The cassette 10 is able to withstand chemicals such as sulfuric acid or diluted acid, or solvents such as Freon.

The partial cross-sectional area of rod 80 the H-bar provides for least weight of the cassette, as well as insuring structural integrity. The wafer processing cassette will carry twenty-five wafers, or any other number of wafers as so configured.

SECOND EMBODIMENT

Figure 6:
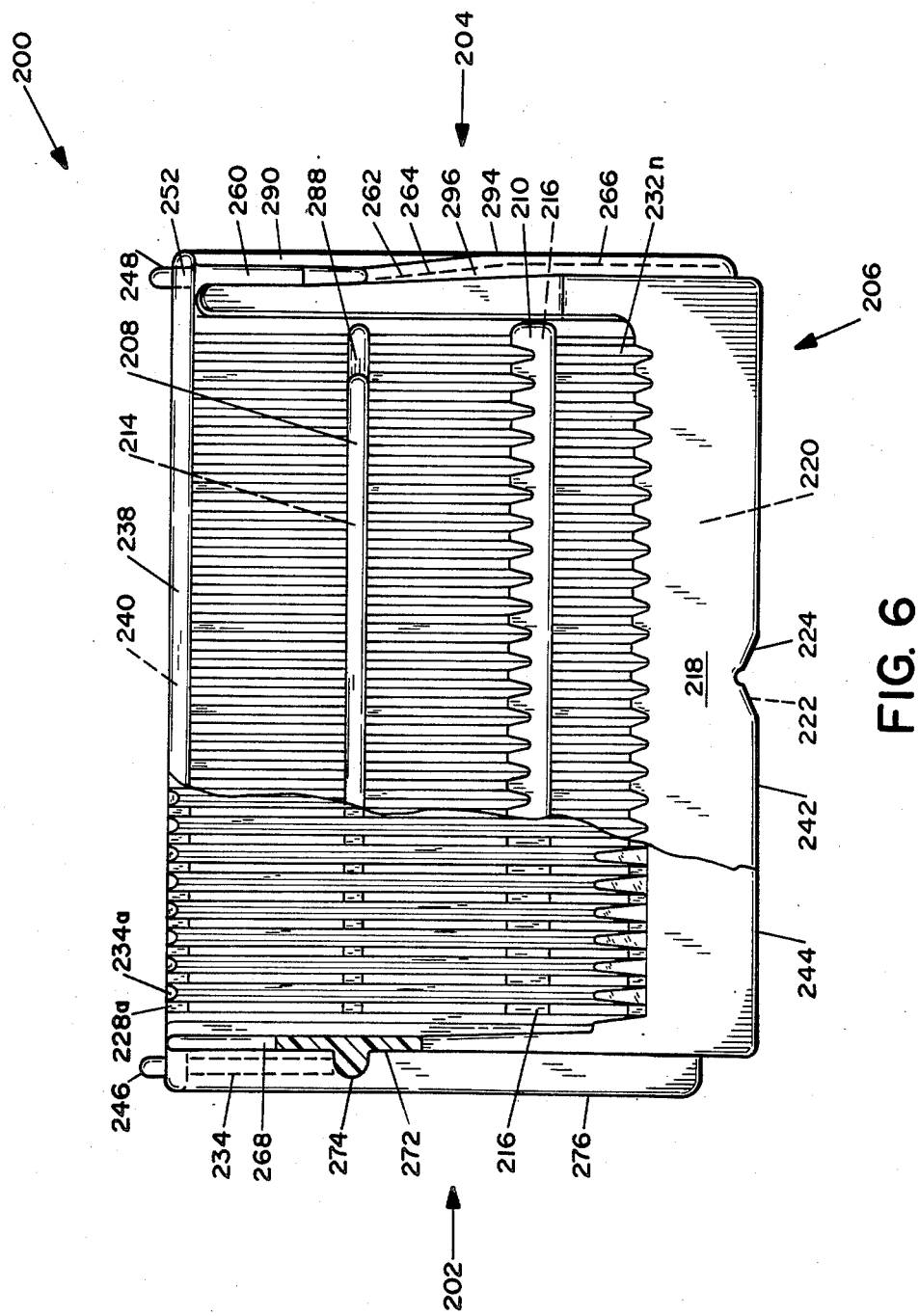
FIG. 6 illustrates a second embodiment, of the present invention, of a plan view of a wafer processing cassette including a portion partially cut away.
Figure 7:
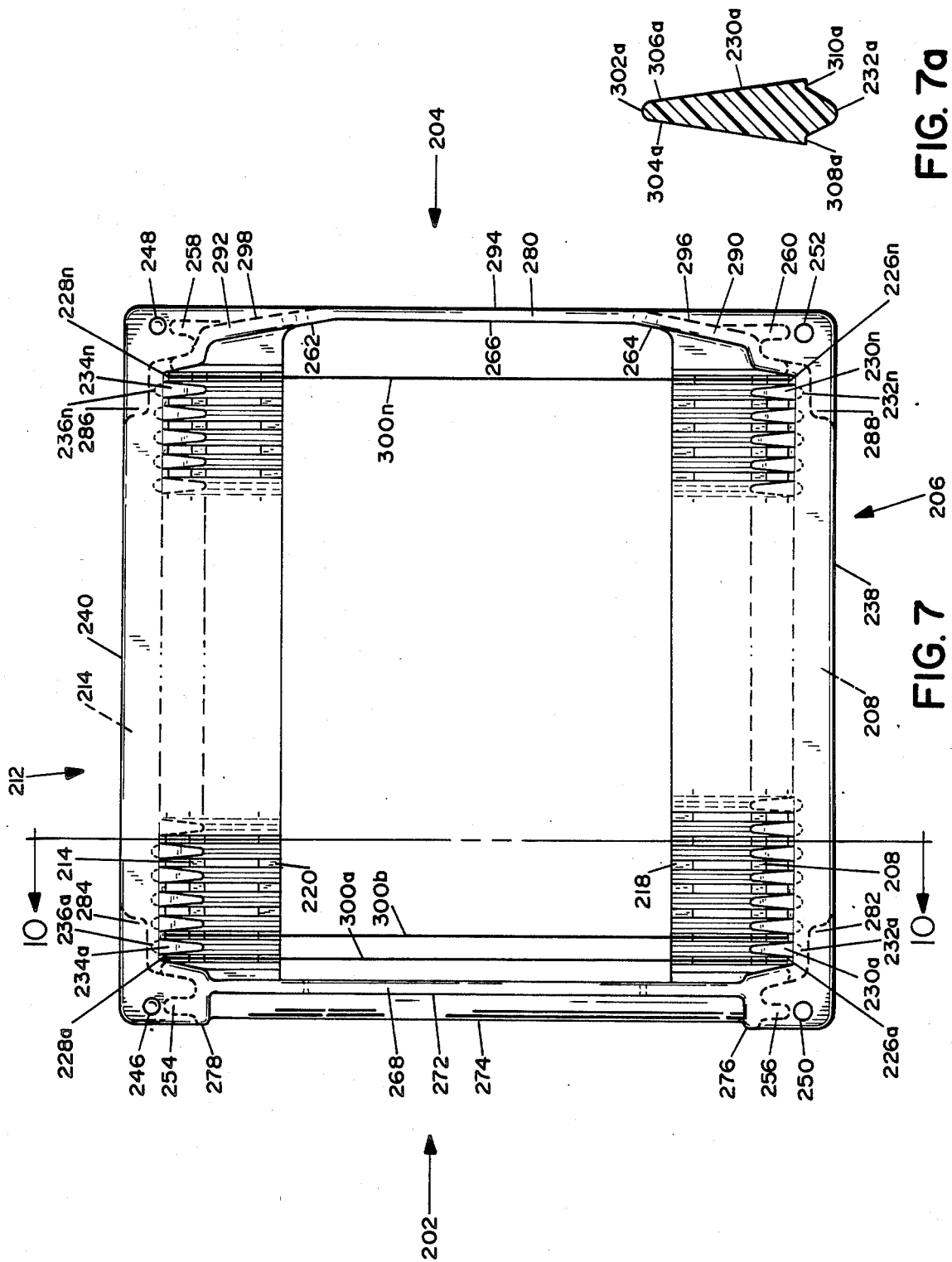
FIG. 7 illustrates a top view.

FIG. 6 illustrates a second embodiment and plan view of a wafer processing cassette 200, the present invention, for processing of circuit wafers such as silicon wafers, including a partially cut away section. Reference is also made to FIGS. 6-10 in the following description. The wafer cassette 200 includes an H-bar end 202 which includes an open area, also illustrated in FIG. 8, a rear end 204 which includes an open area also illustrated in FIG. 9, a right side 206 including an upper edge member 238, a right upper horizontal structural support 208, a right lower horizontal structural support 210, lower member 218, lower edge 242, positioning groove 224, a left side 212 including upper edge member 240, left upper structural horizontal support 214, left lower horizontal structural support 216, lower edge member 220, and a lower edge 244 including positioning groove 222. Angle notches 282 and 288 are located at the outward ends of right upper horizontal structure support 208 and angle notches 284 and 286 are located at the ends of left upper horizontal structure support 214. A plurality of right indexing slots 226a-226n and left indexing slots 228a-228n opposing the right indexing slots are also provided for in the lower edges. A plurality of geometrically configured wafer dividers assume the geometrical shapes of rounded teeth 230a-230n and 234a-234n which are in opposing alignment with respect to each other, as also shown in FIGS. 7 and 7a, and are supported by the upper horizontal structural supports 208 and 214 and lower horizontal structural wafer supports 210 and 215, upper edge members 238 and 240, and lower edge members 218 and 220 which extend between the front and rear ends 202 and 204, respectively. The horizontal structural supports 208, 210, 214, and 216, as well as the dividers, correspond to the geometry of the radial circumference of the wafer providing slight perimeter contact with the wafer and in this particular instance corresponds to a 125 millimeter diameter wafer. Rounded lower support horizontal edges of lower horizontal structure supports 210 and 216 connect between the ends 202 and 204 and provide additional perimeter edge support to the wafers. The supports extend outwardly along a portion of the horizontal length as illustrated in the figures as described.

Figure 8:
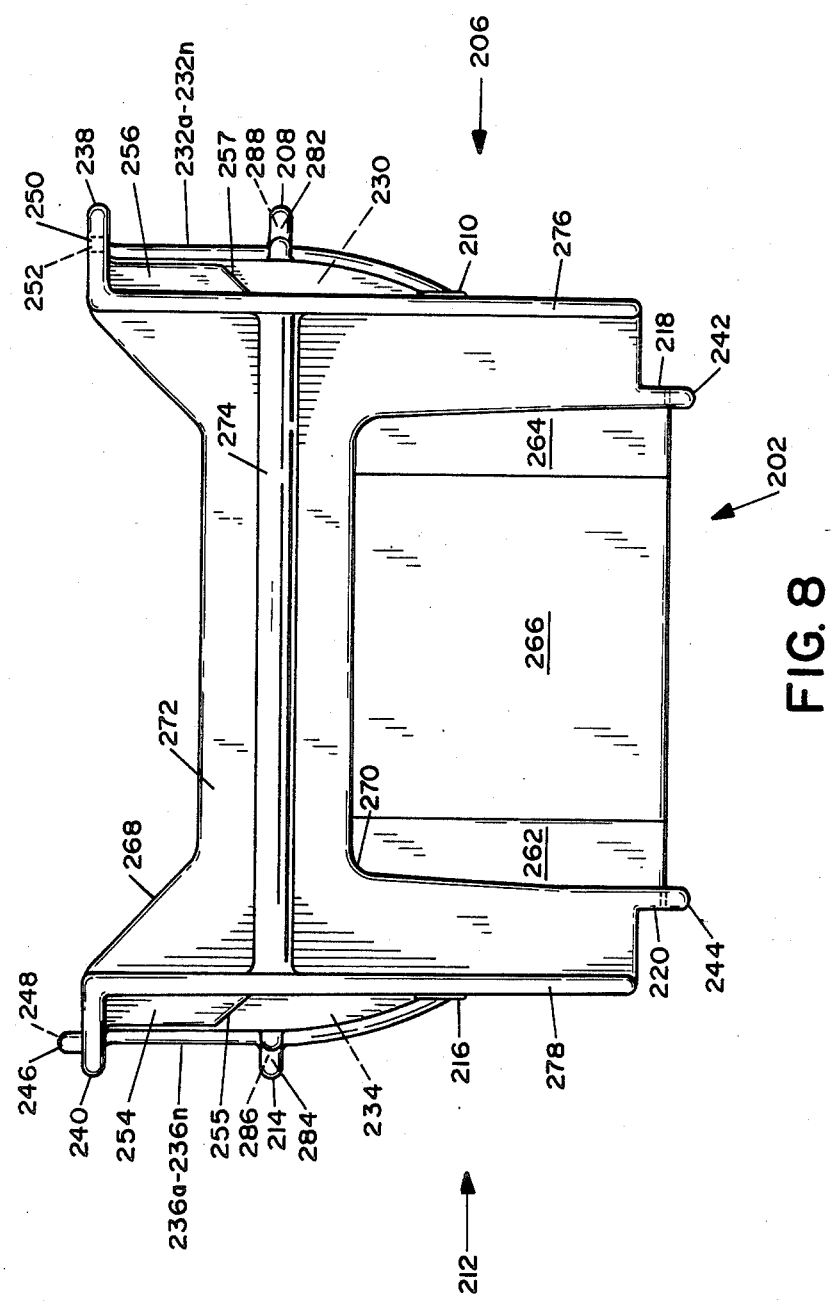
FIG. 8 illustrates the H-bar end, front view.
Figure 9:
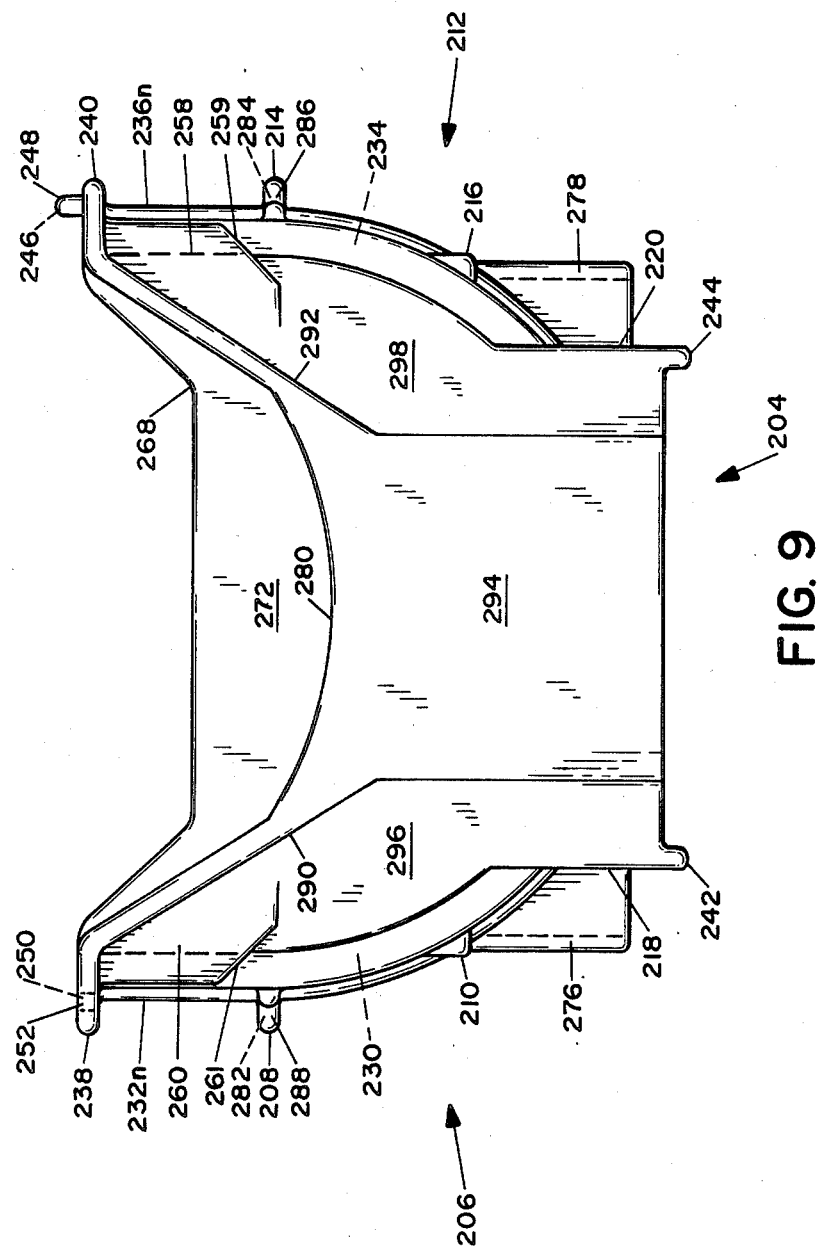
FIG. 9 illustrates a rear, end view.

The wafer processing cassette 200 includes processing locating pins 246 and 248, and processing locating holes 250 and 252. The cassette 200 also includes opposing angled interior sides 262 and 264, and an interior end 266. The H-bar end 202 includes a ramped top edge 268 and an upper open area above the edge and a rounded lower edge 270 and a lower rectangular open area beneath and below edge 270, as illustrated in FIG. 8. The H-bar center 272 includes a partial section of a cylindrical rod 274 extending between members 276 and 278. H-bar end 202, and vertical edge bar members on the right side 276 and on the left side 278 provide for additional support and bearing surfaces. Forward locator vertical support bars 254 and 256, with inwardly ramped bottom surfaces 255 and 257, extend outwardly and downwardly from the junction area of upper edge member 240 and vertical edge bar 278 and also upper edge member 238 and vertical edge bar 276, respectively. Large locator vertical support bars 258 and 260 extend in a like manner outwardly and downwardly, with inwardly ramped bottom surfaces 259 and 261, from the rear under surface of the upper edge members 240 and 238 adjacent to reinforcing edges 292 and also from the rear under surface of the upper edge member 238 and adjacent to reinforcing edge 290 and die or blend into surfaces 298 and 296, respectively, as shown in FIGS. 7, 8, and 9.

FIG. 7 illustrates a top view of a wafer cassette 200 where all numerals correspond to those elements previously described. Particularly, wafers 300a-300n are illustrated for being supported in between the wafer dividers 230a-230n and 234a-234n. The top view also illustrates the unique geometrical shape of the wafer teeth with rounded exterior and interior edges of each tooth. The locating pins 246 and 248 and locating holes 250 and 252 with forward and rear locator vertical support bars 254, 256, 260, and 258 are shown accordingly. Angle notches 282, 284, 286, and 288 are illustrated at the ends of upper horizontal structural supports 208 and 214 providing for minimum weight of the cassette.

FIG. 7a illustrates a cross-section of representative divider tooth 230a of teeth 230a-230n opposing divider teeth 234a-234n including a rounded interior tooth edge 302a, left and right vertical sides 304a and 306a, divider backs 308a and 310a, and rounded exterior tooth edge strengthener 232a for each tooth. The sides 304a and 306a are at an angle with respect to each other.

FIG. 8 illustrates a front view of the H-bar end 202, where all numerals correspond to those elements previously described. In particular, the ramped top edge 268 of the H-bar end, as well as the rounded edges of the rectangular portion are illustrated along with the supporting partial cylindrical rod 274, as well as the rounded exterior tooth edge strengtheners 236a-236n and 232a-232n which intersect with horizontal upper edge members 240 and 238, upper horizontal support structures 214 and 208, lower horizontal support structures 216 and 210 of FIG. 9 and lower edge members 220 and 218, also of FIG. 9, all contributing to structural support and strength of the wafer processing cassette 200. The vertical edges 276 and 278 and ramped surfaces 255 and 257 provide and act as bearing surfaces. The cassette can be utilized in an upright position during automated wafer processing when the cassette is in a horizontal mode or in a vertical mode. Each of the dividers' outer edge extends vertically to the horizontal supports and then conformingly curves to the wafer.

FIG. 9 illustrates a rear end view of the wafer cassette 200 where all numerals correspond to those elements previously described. Particularly illustrated is the rounded open area reversed arch 280 providing the rear end open portion. Reinforcing edges 290 and 292 extending downwardly and inwardly from the upper edge members 238 and 240, and provide for additional rear-end structural support and connect to surface rear 294. The surfaces 290, 292, and 294 also serve as bearing surfaces. Surfaces 296 and 298 also provide for rear-end support as illustrated.

MODE OF OPERATION

The wafers 300 are positioned into the wafer cassette 200 for processing. The cassette can also be used for storage or for transportation. The intended purpose of the present invention, though, is for robotic automated processing. The wafer cassette 200 can be utilized with on-center processing equipment or other types of processing equipment. The wafer cassette 200 is unique in being functional for all types of processing equipment for integrated circuits in a horizontal or a vertical mode.

Figure 10:
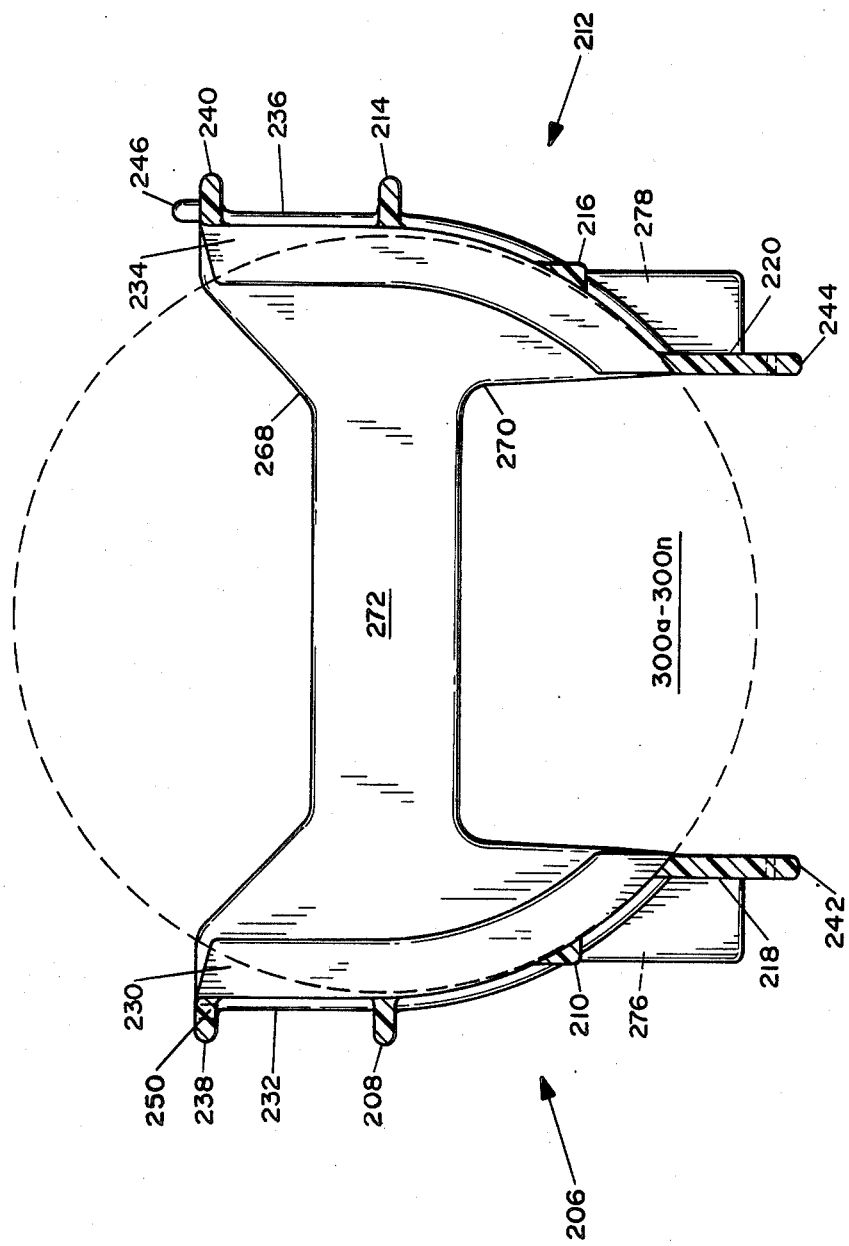
FIG. 10 illustrates a view taken along line 10—10 of FIG. 7.

FIG. 10 particularly illustrates a view taken along line 10—10 of FIG. 7 showing the point contact, as well as perimeter contact to the edges of the wafer disk 300 which is minimized for purposes of processing by automated equipment.

In this invention, the dividers supporting the wafers are supported by structure providing for maximized open area for such automated processing steps. Fluids, as well as air, or gaseous vapors, can pass through the open areas of the dividers and about the open ends, especially during chemical processes or washing processes. The cassette 200 is able to withstand chemicals such as sulfuric acid or diluted acid, or solvents such as Frcon.

The partial cross-sectional area of rod 274 the H-bar provides for least weight of the cassette, as well as insuring structural integrity. The wafer processing cassette will carry twenty-five wafers, or any other number of wafers as so configured.

THIRD EMBODIMENT

Figure 11:
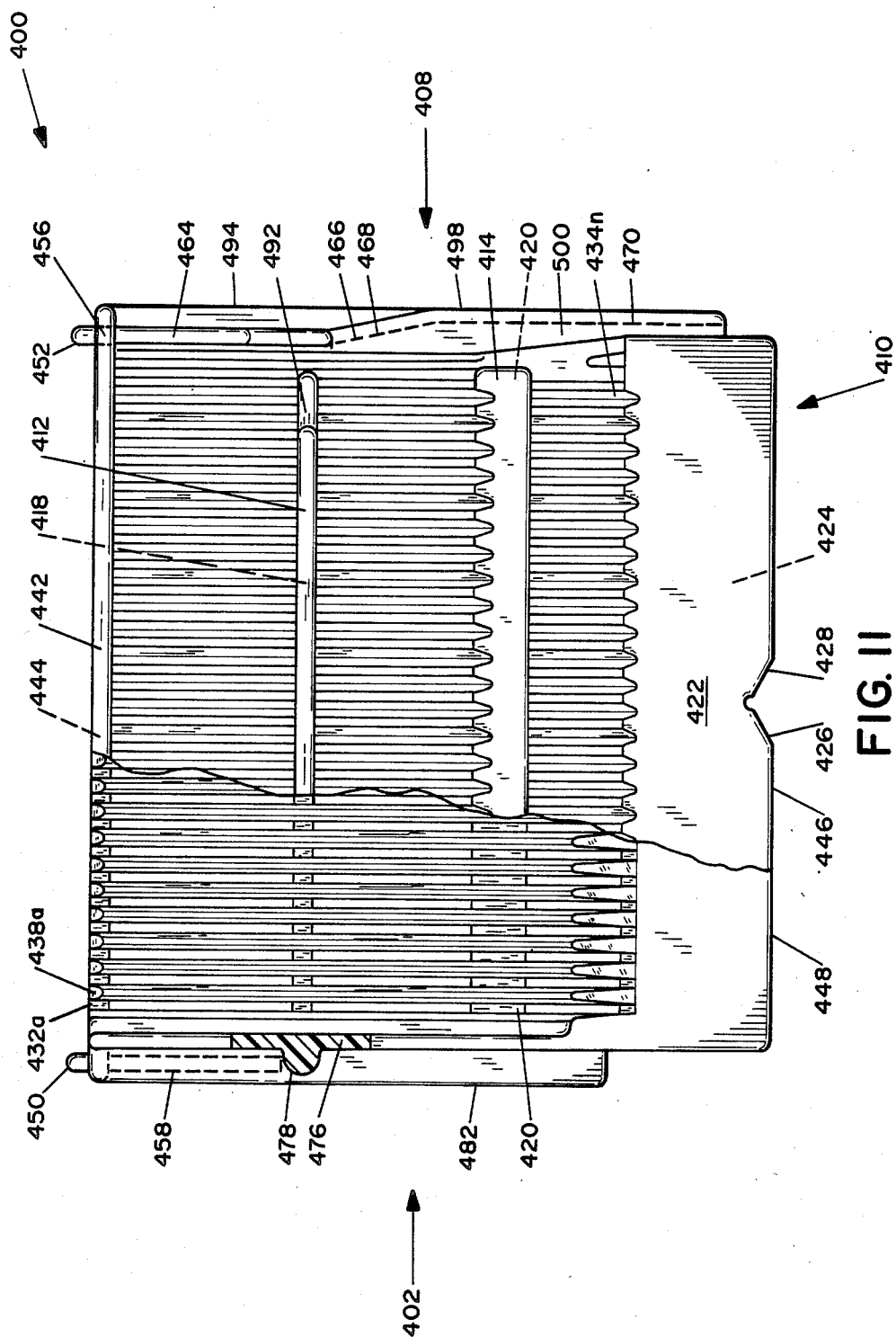
FIG. 11 illustrates a third embodiment, of the present invention, of a plan view of a wafer processing cassette including a portion partially cut away.
Figure 12:
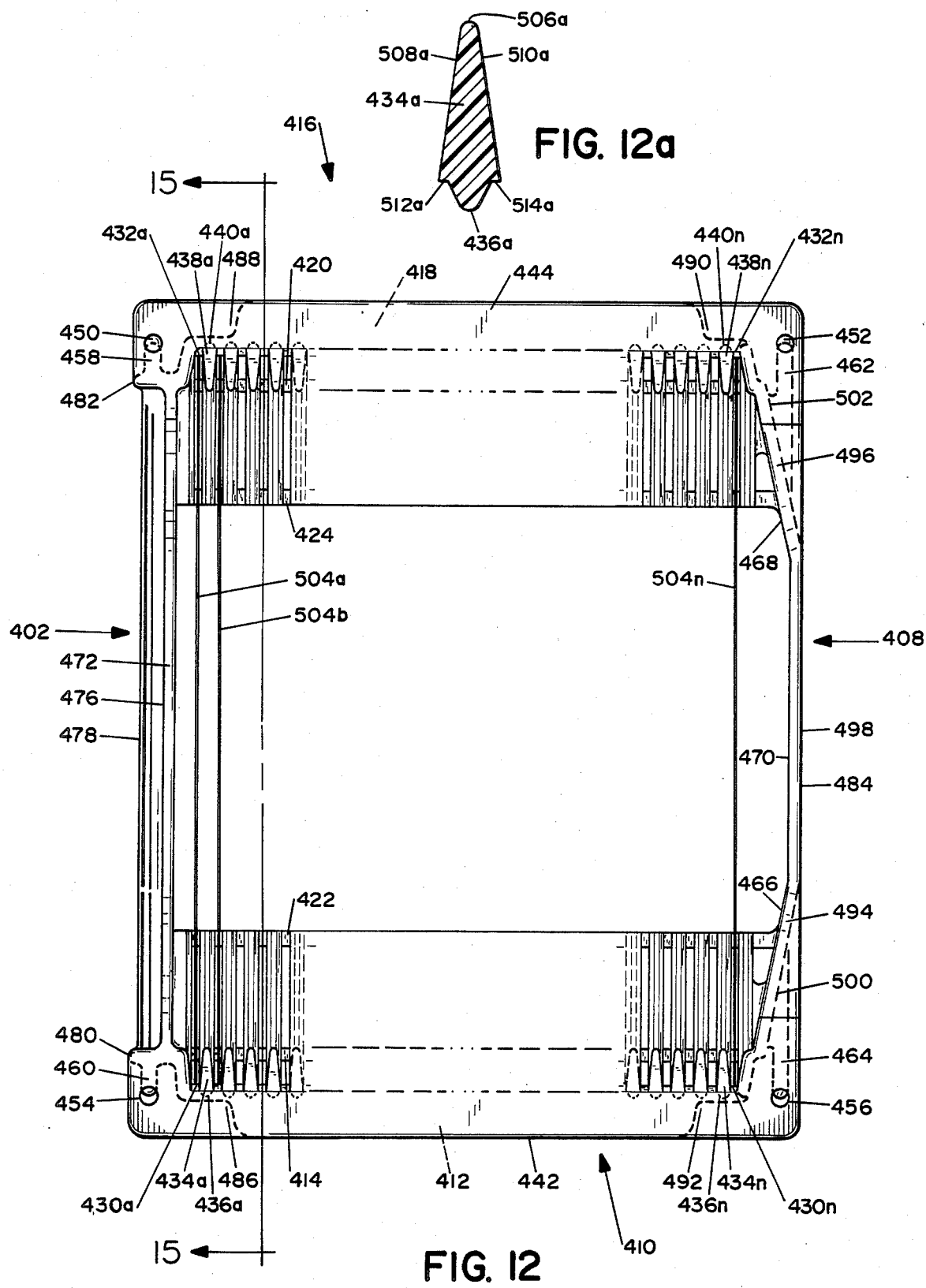
FIG. 12 illustrates a top view.
Figure 13:
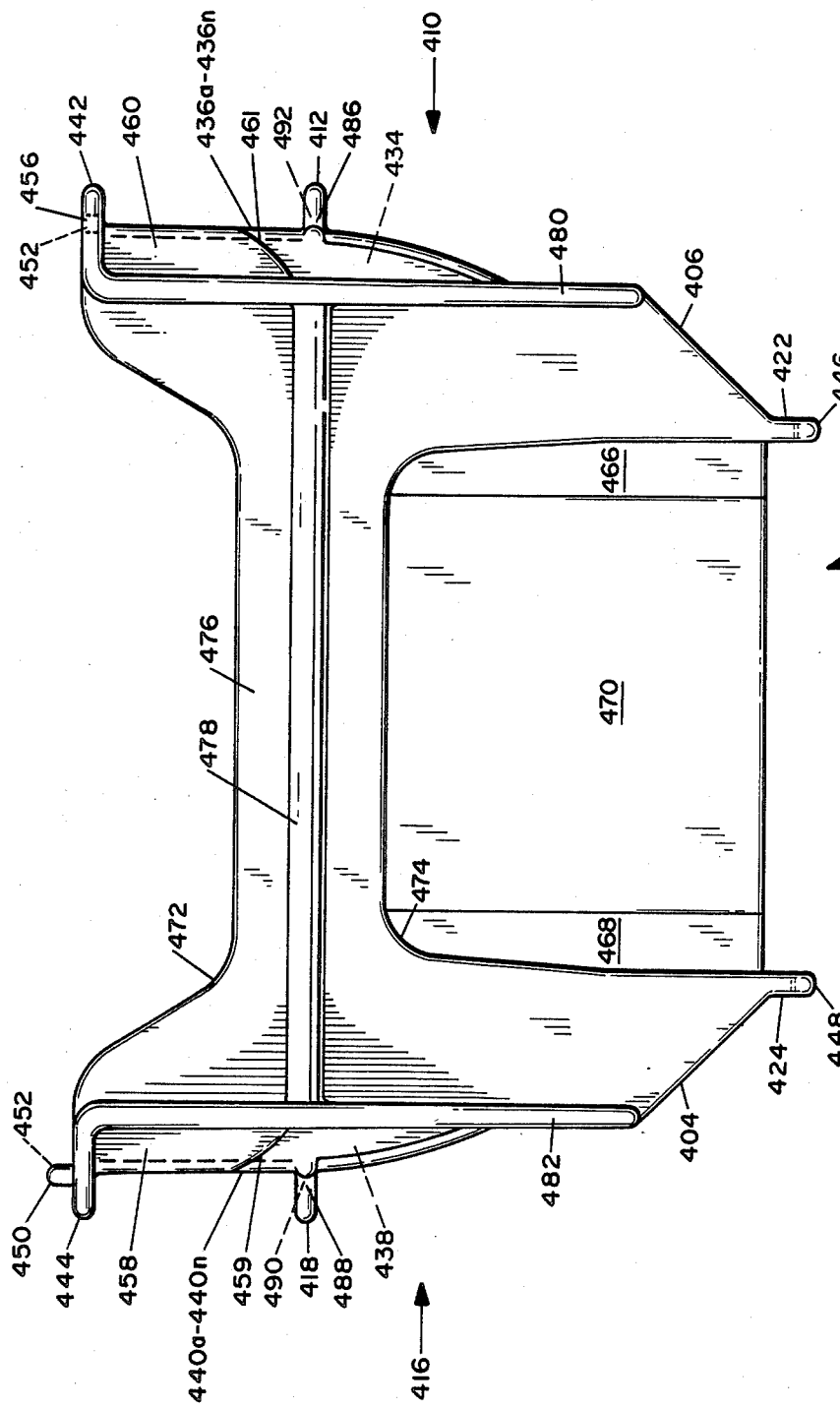
FIG. 13 illustrates the H-bar end, front view.

FIG. 11 illustrates a third embodiment and plan view of a wafer processing cassette 400, the present invention, for processing integrated circuit wafers such as silicon wafers, including a partially cut away section. Reference is also made to FIGS. 11-15 in the following description. The wafer cassette 400 includes an H-bar end 402, as illustrated in FIG. 13 and which includes an open area, a rear end 408 which includes an open area, also illustrated in FIG. 14, a right side 410 including an upper edge member 442, a right upper horizontal structural support 412 and a right lower horizontal structural support 414, a lower edge member 422, a lower edge 446 including positioning groove 428, a left side 424 including left upper edge member 444, left upper structural horizontal support and left lower horizontal structural supports 418 and 420, respectively, and lower edge member 424 including lower edge 448 and positioning groove 426. Angle notches 486 and 492 are located at the outward ends of right upper horizontal structure support 412 and angle notches 488 and 490, are located at the ends of left upper horizontal support structure 418. A plurality of right indexing slots 430a-430n and left indexing slots 432a-432n opposing the right indexing slots, are also provided for in the lower edges. A plurality of geometrically configured wafer dividers assuming geometrical shapes of rounded teeth 434a-434n and 438a-438n are in opposing alignment with respect to each other, as also shown in FIGS. 12 and 12a, and are supported by the upper horizontal structural supports 412 and 418 and lower horizontal structural wafer supports 414 and 420, upper edge members 442 and 444 and lower edge members 422 and 424 which extend between the front and rear ends 402 and 408, respectively. The horizontal structural supports 412, 418, 414, and 420, as well as the dividers, correspond to the geometry of the radial circumference of the wafer providing slight perimeter contact with the wafer, and in this particular instance corresponds to a 150 millimeter diameter wafer. Rounded lower support horizontal edges of lower horizontal structure supports 414 and 420 connect between the ends 402 and 408, and provide additional perimeter edge support to the wafers. These supports extend outwardly along a portion of the horizontal length as illustrated in the figures as now described.

The wafer processing cassette 400 includes processing locating pins 450 and 452, and processing locating holes 454 and 456. The cassette 400 also includes opposing angled interior sides 466 and 468, and an interior end 470. The H-bar end 402 includes a ramped top edge 472 and an upper open area, and a rounded lower edge 474 and a lower rectangular open area beneath edge 474, as illustrated in FIG. 13. The H-bar center 476 includes a partial section of a cylindrical rod 478 extending between members 480 and 482. H-bar end 402 and vertical edge bars on the right side 480 and on the left side 482, with downwardly and inwardly angled edges 406 and 408, for weight and material considerations, provide for additional support and bearing surfaces. Forward locator vertical support bars 458 and 460, with inwardly ramped bottom surfaces 459 and 461 extend outwardly and downwardly from the junction area of upper edge member 444 and vertical edge bar 482 and also from the junction area of upper edge member 442 and vertical edge bar 480, respectively. Large locator vertical support bars 462 and 464 extend in a like manner, outwardly and downwardly, with inwardly ramped bottom surfaces 463 and 464, from the rear under surface of the upper edge member 444 and reinforcing edge 496 and also the rear under surface of the upper edge member 442 and reinforcement edge 444, respectively.

FIG. 12 illustrates a top view of a wafer cassette 400 where all numerals correspond to those elements previously described. Particularly, wafers 504a-504n are illustrated for being supported in between the wafer dividers 434a-434n and 438a-438n. The top view also illustrates the unique geometrical shape of the wafer teeth with rounded exterior and interior edges of each tooth strengthener 440a-440n and 436a-436n, as well as the locating pins 450 and 452 and locating holes 454 and 456 with forward and rear locator support bars 458, 460, 462, and 464 are shown accordingly. Angle notches 486, 488, 490, and 492 are illustrated at the ends of upper horizontal structural supports 412 and 418 providing for minimum weight of the cassette.

FIG. 12a illustrates a cross-section of representative divider tooth 434a of teeth 434a-434n opposing divider teeth 438a-438n including a rounded interior tooth edge 506a, left and right vertical sides 508a and 510a, divider backs 512a and 514a, and rounded exterior tooth edge strengthener 436a. The sides 508a and 510a are at an angle with respect to each other.

FIG. 13 illustrates a front view of the H-bar end 402. where all numerals correspond to those elements previously described. The particular ramped portion 472 of the H-bar end, as well as the rounded edges 474 of the rectangular area portion is illustrated along with the supporting partial cylindrical rod 478, as well as the rounded exterior tooth edge strengtheners 440a-440n and 436a-436n which intersect with horizontal upper edge members 444 and 442, upper horizontal support structures 418 and 412, lower horizontal support structures 420 and 414 of FIG. 14 and lower edge members 424 and 422, also of FIG. 14, all contributing to structural support and strength of the wafer processing cassette 400. The vertical edges 480 and 482, and ramped surfaces 461 and 459, provide and act as bearing surfaces. The cassette can be utilized in an upright position during automated wafer processing when the cassette is in a horizontal mode or in a vertical mode. Each of the dividers' outer edge extends vertically to the horizontal supports and then conformingly curves to the wafer.

Figure 14:
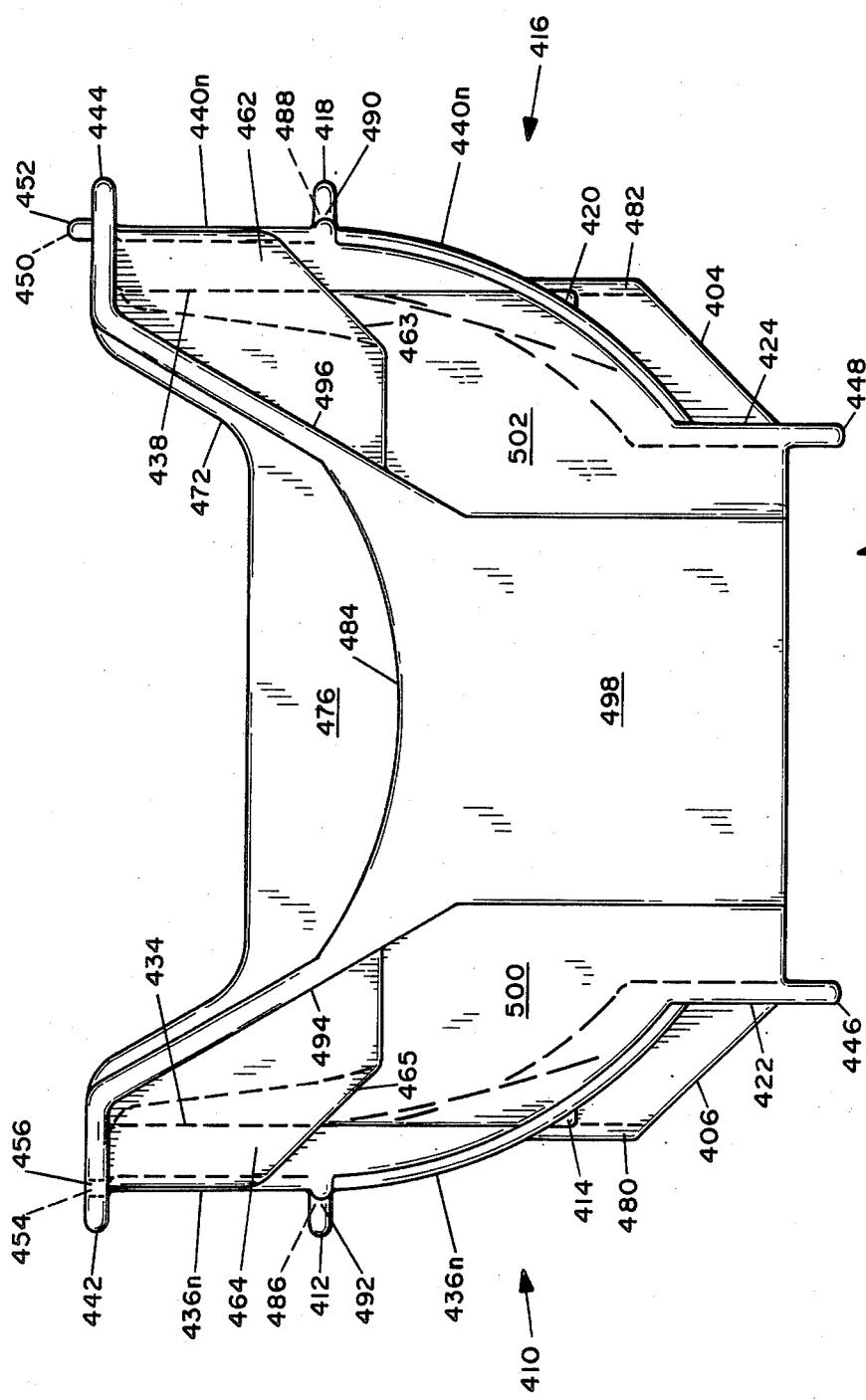
FIG. 14 illustrates a rear, end view.

FIG. 14 illustrates a rear end view of the wafer cassette 400 where all numerals correspond to those elements previously described. Particularly illustrated is the rounded open area reversed arch 484 providing the rear end open portion. Reinforcing edges 494 and 496 extending downwardly and inwardly from the upper edge members 442 and 444, and provide for additional rear-end structural support and connect to rear surface 498. The surfaces 494, 496, and 498 also serve as bearing surfaces. Surfaces 500 and 502 also provide for rear-end support as illustrated.

MODE OF OPERATION

The wafers 504 are positioned into the wafer cassette 400 for processing. The cassette can also be used for storage or for transportation. The intended purpose of the present invention, though, is for robotic automated processing. The wafer cassette 400 can be utilized on-center processing equipment or other types of processing equipment. The wafer cassette 400 is unique in being functional for all types of processing equipment for integrated circuits in a horizontal or a vertical mode.

Figure 15:
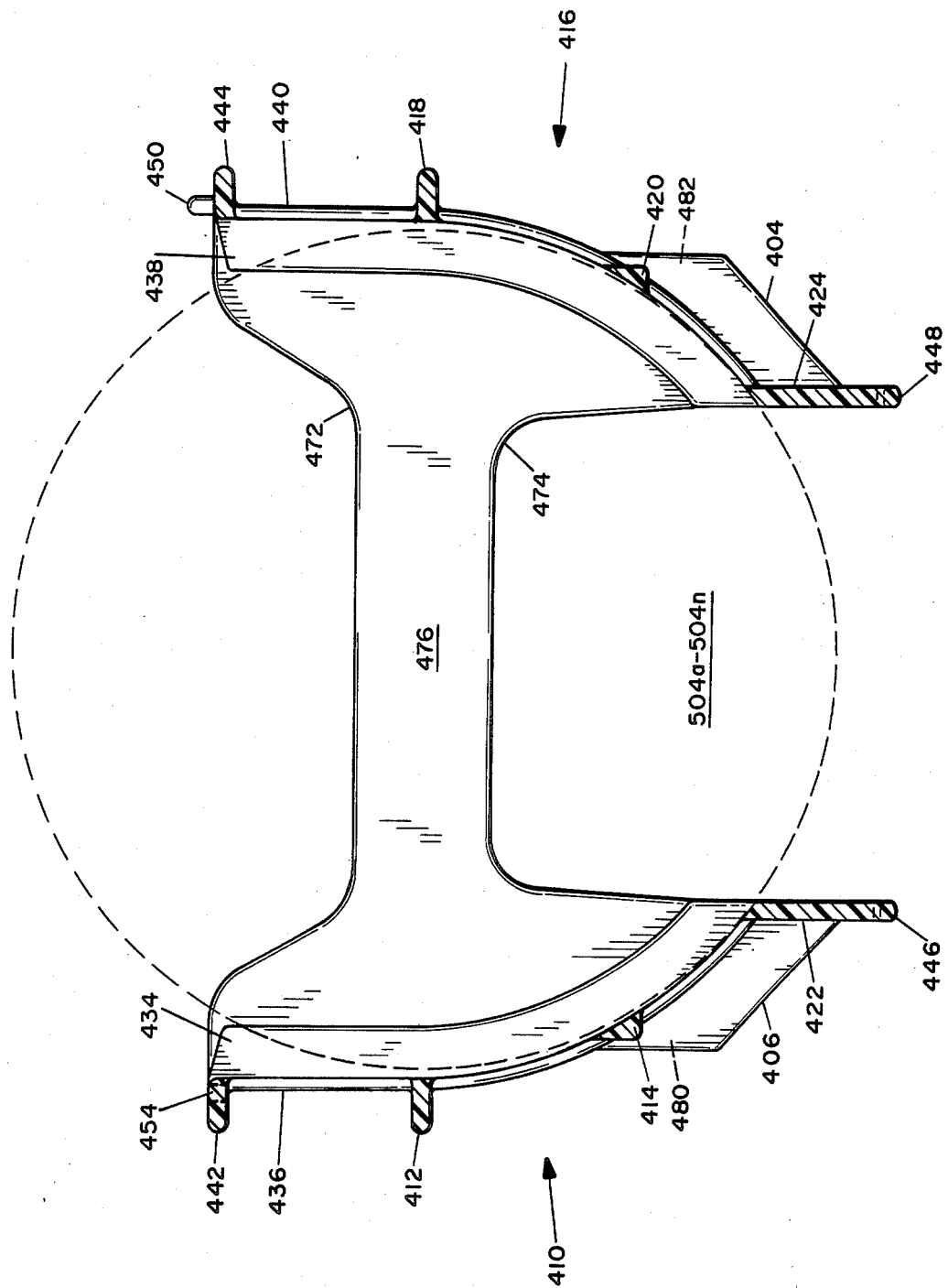
FIG. 15 illustrates a view taken along line 15—15 of FIG. 12.

FIG. 15 particularly illustrates a view taken along line 15—15 of FIG. 12 showing the point contact, as well as perimeter contact to the edges of the wafer disk 400 which is minimized for purposes of processing by automated equipment.

In this invention, the dividers supporting the wafers are supported by structure providing for maximized open area for such automated processing steps. Fluids, as well as air, or gaseous vapors, can pass through the open areas of the dividers and about the open ends, especially during chemical processes or washing processes. The cassette 400 is able to withstand chemicals such as sulfuric acid or diluted acid, or solvents such as Freon.

The partial cross-sectional area of rod 478 the H-bar provides for least weight of the cassette, as well as insuring structural integrity. The wafer processing cassette will carry twenty-five wafers, or any other number of wafers as so configured.

Various modifications can be made to the present invention without departing from the apparent scope thereof.

I claim:
1. Wafer cassette comprising:
   a. plurality of opposing wafer dividers, each of said dividers including an interiorly facing rounded tooth edge, vertical surfaces at opposite sides of said interiorly facing rounded tooth edge, a rounded exteriorly facing tooth edge with exteriorly facing substantially flat surfaces between said vertical surface and said exteriorly facing rounded tooth edge and including a portion rounded along a perimeter of a wafer for encompassing and conforming to circumference of the wafer;
   b. upper and lower opposing longitudinal horizontal supports supporting said wafer dividers, said lower horizontal supports having a length less than that of said upper horizontal supports;
   c. plurality of opposing upper and lower edge members and opposing rounded vertical side members for supporting said wafer dividers;
   d. rear-end member including a substantially downward arch providing an open top portion and secured to said side members; and,
   e. open H-bar end front member, said H-bar end including opposing vertical reinforcing edge mem- bers, a horizontal H-bar member running therebetween, said horizontal H-bar member including a reinforcing partial section cylindrical rod, and an upper ramped portion and a lower rectangular portion about said H-bar whereby said open area of said H-bar end, said rear end, and upper and lower horizontal supports attach to each said wafer dividers provides for structural integrity and nonrestricted open surface automated processing of wafers, thereby providing a structurally integral wafer cassette for integrated circuit automated processing of said wafers in a wafer cassette.

2. Wafer cassette of claim 1 including opposing ramped vertical support bars at each end.

* * * * *